United States Patent [19]

Naber

[11] 3,777,277

[45] Dec. 4, 1973

[54] DISCRETE STEP FREQUENCY SWEEP

[75] Inventor: Robert H. Naber, Mt. Vernon, N.H.

[73] Assignee: The United States of America as represented by the Secretary of the Navy, Washington, D.C.

[22] Filed: Feb. 23, 1973

[21] Appl. No.: 335,265

[52] U.S. Cl. .................................. 331/49, 331/179
[51] Int. Cl. .......................................... H03b 23/00
[58] Field of Search ...................... 331/49, 178, 179

[56] References Cited

UNITED STATES PATENTS

| | | | |
|---|---|---|---|
| 3,226,648 | 12/1965 | Davidson | 331/49 X |
| 3,573,663 | 4/1971 | Huge et al. | 331/179 X |

*Primary Examiner*—Herman Karl Saalbach
*Assistant Examiner*—Siegfried H. Grimm
*Attorney*—R. S. Sciascia et al.

[57] ABSTRACT

A frequency sweep generator for generating a repetitive series of constant amplitude, stable, discrete step frequency outputs. Eight crystal oscillators of increasingly higher frequencies are divided into odd and even groups of four oscillators each. Dual selecting circuits each comprising a three bit binary counter triggered by a periodic step command, a two bit decoder and four sampling gates, alternately select in numerical sequence one oscillator output from each of the groups. A delay circuit delays the step command one full period before triggering the even group binary counter. Each oscillator output is energized for a duration of two step command periods and the least significant bit of the odd group binary counter alternately selects the odd and even groups of parallel gates for a single step command period thus allowing each frequency output to warm up and stabilize due to advanced turn-on of the next required oscillator prior to sampling its output. The outputs of eight sampling gates are connected in common to provide a serial output.

9 Claims, 2 Drawing Figures

DISCRETE STEP FREQUENCY SWEEP

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates generally to frequency sweep generators and particularly to a generator which sweeps through a plurality of stabilized, constant amplitude, discrete step frequencies.

In generating a series of differing frequencies, it is desirable that the selected frequencies be presented in an accurate, constant amplitude an maximally stabilized form. Prior art frequency sweep generators of the continuous tuning type often presented problems in maintaining frequency linearity while being swept through the applicable frequency range In another type, many oscillators were run continuously and their outputs sequentially selected, but unwanted oscillator frequencies and the attendant noise that they produce cannot be sufficiently rejected or reduced by conventional switching means. Generators which energize a particular oscillator frequency upon demand do not allow for rapid frequency stepping due to the extra turn-on time required by the oscillator.

SUMMARY OF THE INVENTION

Accordingly, it is an object of the present invention to provide a frequency sweep generator that will accurately generate a rapidly stepped series of discrete frequencies. Another object of the invention is to provid constant amplitude, stabilized frequency step outputs by advanced turn-on of the next required frequency oscillator prior to its sampling.

Briefly, these and other objects are accomplished by a discrete step frequency sweep generator wherein a first binary counter is cleared to its initial count. Periodic step command pulses clock the counter and advance it through all possible counts. All but the least significant bit of the counter are connected to a first decoder which selects one of a plurality of outputs dependent upon the binary combination of bits received from the counter. The plurality of first decoder outputs are connected to a first plurality of crystal oscillators wherein a selected one of the decoder outputs energizes the appropriate oscillator for providing a discrete frequency output. Each of the discrete frequency outputs is connected to a sampling gate which has an enabling input connected to the least significant bit of the first binary counter. Since all but the least significant bit of the first binary counter operatively select the proper crystal oscillator to be energized, the effective count of the binary counter is reduced to half of its full capability and the oscillator frequency output is sustained for a duration of two step command pulse periods. Since the least significant bit of the first binary counter alternates states upon receiving each step command pulse, the sampling gates are enabled to sample oscillator output frequencies only during the second step command pulse period during which the crystal oscillator is energized, thereby ensuring sampling of the selected discrete output frequency at a time when it has reached constant amplitude. Concurrent with the clearing of the first binary counter, an identical second binary counter is also connected to receive the clear command. The second binary counter is clocked by step command pulses which are delayed one pulse period. All but the least significant bit of the second binary counter are connected to a second decoder which outputs are connected to a second plurality of crystal oscillators for energizing a selected one thereof according to the count of the second binary counter. The second plurality of crystal oscillators all have discrete frequency outputs connected to a second plurality of sampling gates which have an enabling input connected through an inverter to the least significant bit of the first binary counter. The least significant bit of the first binary counter alternately enables and inhibits each plurality of sampling gates. All the sampling gates have their outputs commonly connected to a single output terminal for providing a series of discrete step, constant amplitude frequencies.

For a better understanding of these and other aspects of the invention, reference may be made to the following detailed description taken in conjunction with the accompanying drawings.

DESCRIPTION OF THE PREFERRED EMBODIMENT

Figure 1:
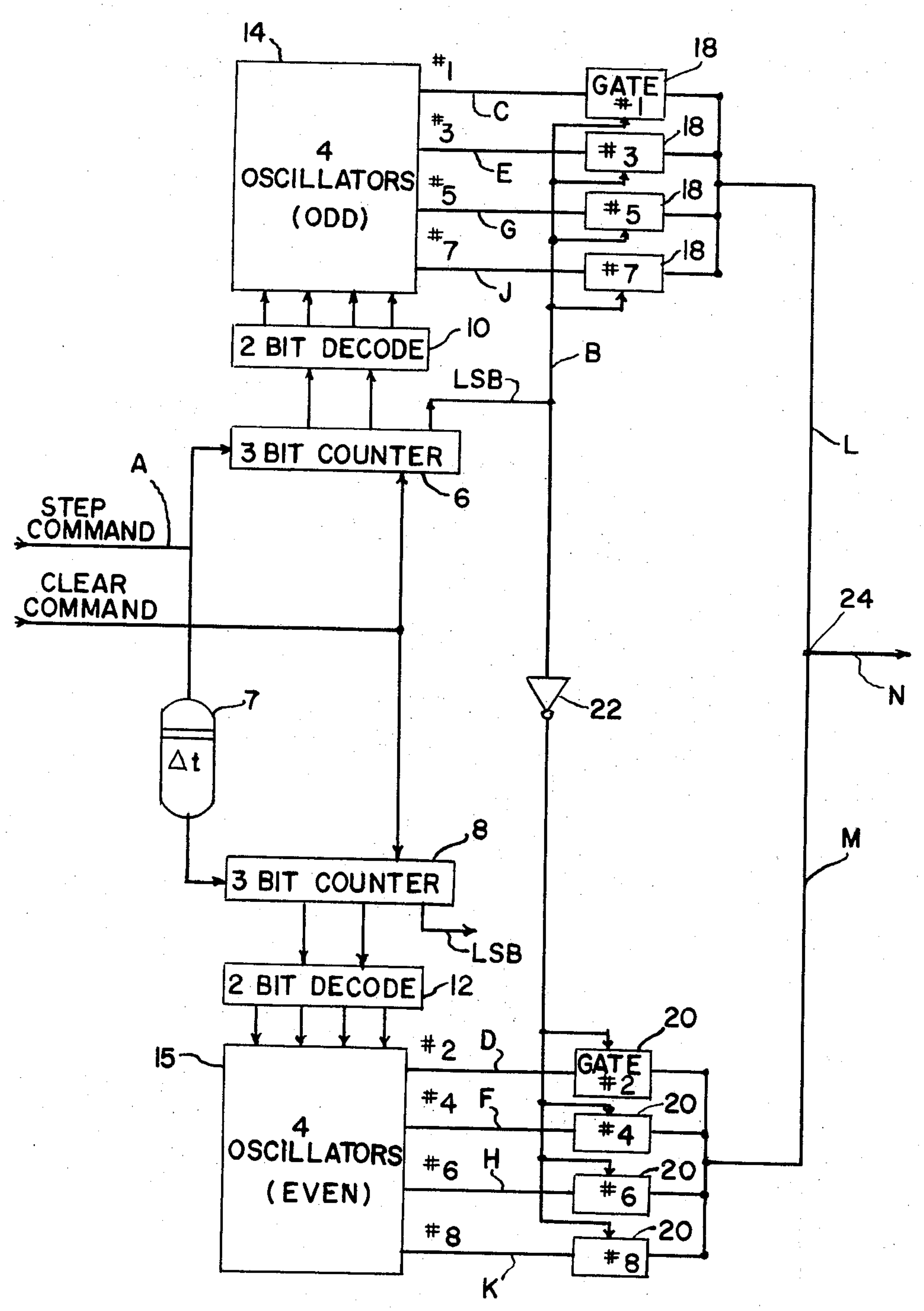
FIG. 1 is a logic diagram of the invention.

Referring now to FIG. 1, a clear command is connected to three bit binary counters 6 and 8 and a periodic step command is simultaneously connected to a clock input of counter 6 and to a delay circuit 7 which provides a signal delay for the druation of one step command period. The two most significant bits of each of the three bit binary counters 6 and 8 have outputs connected respectively to two bit decoders 10 and 12. Each two bit decoder 10 and 12 provides four discrete outputs which are parallelly connected to an odd numered bank of four crystal oscillators 14 and to an even numbered bank of four crystal oscillators 15, respectively. The oscillator banks 14, 15 provide eight discrete frequency outputs which are connected to an odd numbered bank of four sampling gates 18 and an even numbered bank of four sampling gates 20. The least significant bit (LSB) of the three bit binary counter 6 is simultaneously connected to the odd numbered bank of sampling gates 18 and to logic inverter 22. Inverter 22 is connected to provide an inverted output for triggering the even numbered bank of sampling gates 20. Outputs of the odd and even numbered banks of sampling gates are connected to a common output terminal 24.

When the frequency generator is first started, the clear command clears both three bit binary counters 6 and 8 to their "0" states. The two bit decoder 10 senses the "0" states of the two most significant bits of counter 6 and decodes the two bit "0" combination into a single selection which energizes crystal oscillator No. 1 located within the bank of the four odd numbered oscillators 14. Crystal oscillator No. 1 now begins to warm up as it approaches constant amplitude output. Concurrent with the energizing of selected odd oscillator No. 1, three bit counter 8 is also cleared to its "0" state and the two bit decoder 12 decodes the two most significant bits of three bit counter 8 and provides an output which energizes even crystal oscillator No. 2. The No. 2 even oscillator now begins to warm up and approach constant amplitude. A step command is applied to the clock input of three bit counter 6 and to the full period delay 7 and counter 6 now advances from its next count wherein the least significant bit changes from its former "0" state to the "1" state, thereby applying a high active signal to the odd numbered group of four enabling gates 18 numbered 1, 3, 5 and 7. Logic inverter 22 inverts the high signal to a low state thereby inhibiting the even numbered group of four sampling gates 20 numbered 2, 4, 6 and 8. Since the step command triggered the three bit counter 6 so as to count only to the next succeeding state, the states of the two most significant bits remain unchanged and therefore the selected No. 1 oscillator continues to provide a frequency output on line 1 to sampling gate No. 1 within the odd numbered group of gates 18. Gate 1 permits the selected frequency output to be passed to the output terminal 24. For simplicity in describing the operation of the invention, output terminal 24 is shown as a commonly connected wired OR configuration. Such a configuration is possible because only one of the eight discrete output frequencies will be sampled at any given time period. It will be obvious to those skilled in the art, however, that any appropriate OR circuit may be substituted for the purpose of converting all of the parallel sampling gate outputs into a single discrete series of frequencies. Since the clear command cleared the three bit counter 6 prior to the counter 6 receiving its first step command pulse, the selected No. 1 odd crystal oscillator is permitted to warm up to constant amplitude and stability before sampling on the first step command pulse. The next step command pulse triggers the three bit counter 6 to its next state which changes both the state of the least significant bit and the state of the bit position next to the least significant bit. Since the least significant bit is now in the "0" state, the odd numbered sampling gates 18 are inhibited and the even numbered sampling gates 20 are activated. Concurrent with the second step command being applied to the three bit counter 6, the three bit counter 8 now receives its first step command pulse due to the full period delay 7 delaying the first step command by one period. The three bit counter 8 now counts to its next succeeding state and the two most significant bits remain in their previous state and continue to operatively energize the No. 2 oscillator by way of the two bit decoder 12. The selected No. 2 crystal oscillator provides a frequency output on line 2 to sampling gate 2. The 2 frequency output is then passed to the output terminal 24. The 3rd step command then triggers the three bit counter 6 to its next succeeding state thereby changing the least significant bit to enable the output of the No. 3 odd oscillator to be conducted through the 3 sampling gate 18 to the output terminal 24. These operations are then sequentially repeated with every application of a new step command pulse and the three bit binary counters 6 and 8 step through all possible counts which are properly decoded to appropriately energize all of the eight oscillator outputs in a sequentially time shared basis in which the oscillator output is sampled only after allowing the selected oscillator to warm up to constant amplitude and full stability one full step command pulse period before sampling.

Figure 2:
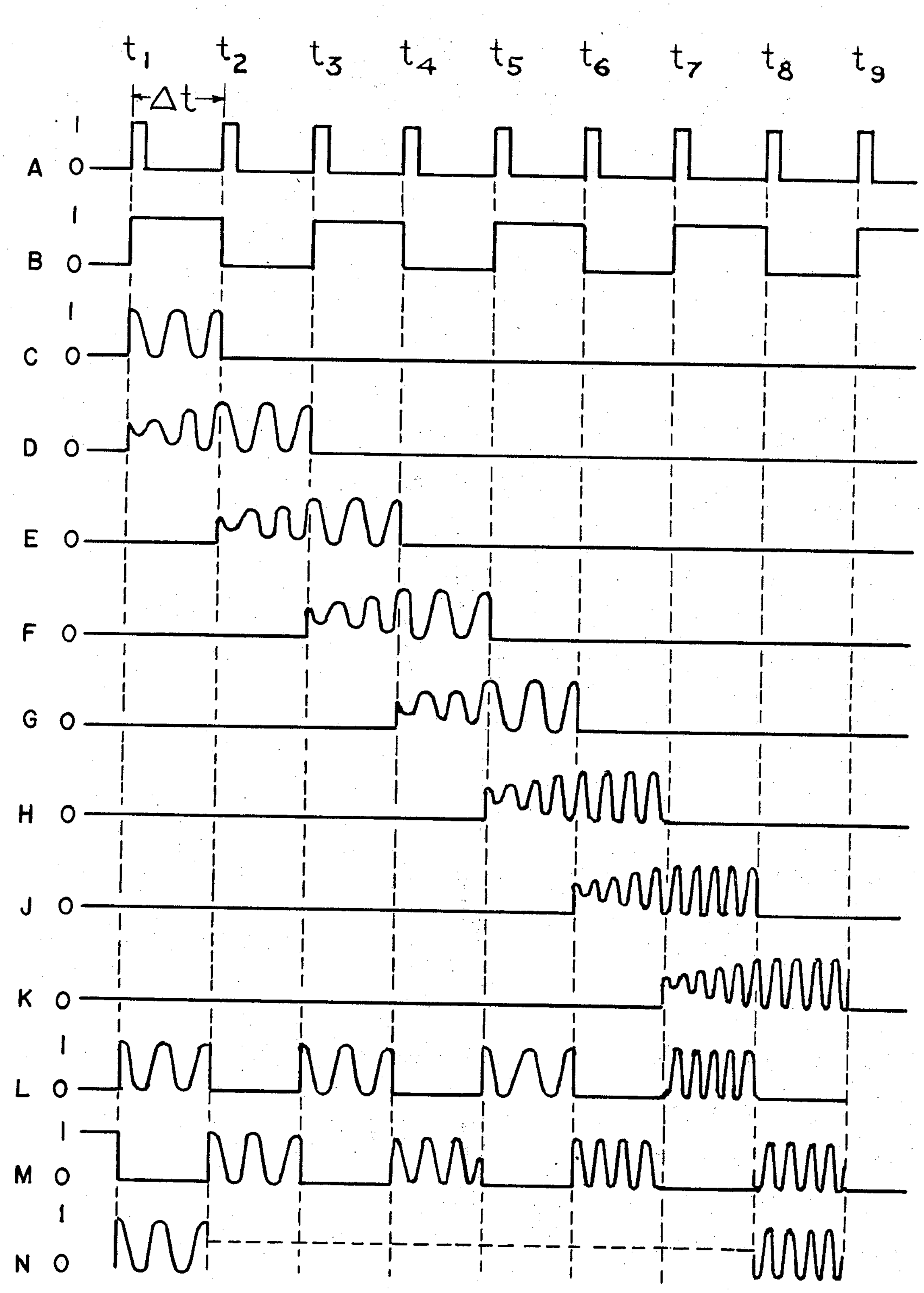
FIG. 2 is a waveform timing chart describing signals generated by the invention.

For a better understanding of the invention, reference is now made to FIG. 2 in conjunction with FIG. 1, which illustrates the pertinent waveforms that are generated by the frequency sweep generator. The step command pulses, which are connected to the binary counter 6 and delay circuit 7, are shown in waveform A as $t_1$, $t_2 - t_9$ and have a period of Δt which is equal to the time difference of any two succeeding pulses. The LSB of counter 6 provides an output waveform B whch alternates from a binary "1" state to a binary "0" upon every application of a single step command pulse. All oscillator frequency outputs as shown in waveforms C, D, E, F, G, H, J, K, are energized for a duration of two command step pulse periods as, for example $t_1$ to $t_3$ shown in waveform D in which the oscillator output is at a minimal amplitude and stability during the first pulse period $t_1$ to $t_2$, and the output attains constant amplitude and maximum stability during the second pulse period $t_2$ to $t_3$. Due to the full period delay in clocking the even numbered counter 8, the even numbered (2, 4, 6, 8) oscillator output frequencies as shown in waveforms D, F, H and K, respectively, are delayed one period behind the odd numbered (1, 3, 5, 7) osicllator output frequencies as shown in waveforms C, E, G and J. Waveform L describes all four of the gate outputs of the odd numbered, discrete frequencies as shown associated with odd oscillator outputs 1, 3, 5, 7, which are enabled and sampled when the LSB of counter 6 is in the "1" state as shown in waveform B. Alternatively, as shown in waveform M the even numbered gate output frequencies are sampled and enabled when the LSB of counter 6 is in the "0" state. The common output terminal 24 combines the two waveforms L and M into a common series output of eight discrete steps of constant amplitude frequencies as shown in waveform N. It will be obvious to those skilled in the art that the desired series output may take on eight succeeding steps of increasing or decreasing frequencies or any combination thereof. Since the binary counters are of a continuous configuration, the generator will continue to sweep through all of the oscillator frequencies as long as the step command pulses continue to be applied. The step command pulse rate may be adjusted to cause the generator to sweep the frequencies at a very rapid rate consistent with allowing each of the oscillator outputs to warm up and stabilize within one step command period.

Thus it may be seen that there has been provided a novel frequency sweep generator which provides a rapidly stepped series of differing frequencies which are highly stable and of constant amplitude.

Obviously many modifications and variations of the invention are possible in light of the above teachings. It is therefore to be understood that within the scope of the appended claims the invention may be practiced otherwise than as specifically described.

What is claimed is:

1. A frequency sweep generator for producing a periodic series of discrete constant amplitude frequencies, comprising:

first frequency selecting means connected to receive a periodic series of input pulses for sequentially selecting respective ones of a first plurality of discrete frequencies according to the number of said received input pulses, and providing outputs representative of said first plurality of discrete frequencies;

delay means connected to receive said input pulses and for providing output pulses delayed one period;

second frequency selecting means connected to receive said delayed pulses for sequentially selecting respective ones of a second plurality of discrete frequencies according to the number of said received delayed pulses and providing outputs representative of said second plurality of discrete frequencies; and sampling means connected to said first and second frequency selecting means for alternating sampling said outputs representative of said first and second pluralities of discrete frequencies according to the reception of said input pulses by said first frequency selecting means and for providing a common output.

2. A frequency sweep generator as defined in claim 1 wherein said first frequency selecting means comprises:

a first binary counter for receiving said input pulses and for providing a first parallel binary code indicative of the number of input pulses;

a first decoder for receiving all binary bits but the least significant bit of the first code and for selectively energizing one of a plurality of parallel outputs; and a first plurality of discrete freqeuncy oscillators for receiving said first decoder outputs and for providing said outputs representative of said first plurality of discrete frequencies.

3. A frequency sweep generator as defined in claim 2 wherein said first plurality of discrete frequency oscillators are crystal oscillators.

4. A frequency sweep generator as defined in claim 2 wherein said second frequency selecting means comprises:

a second binary counter for receiving said delayed pulses and for providing a second parallel binary code indicative of the number of said delayed input pulses;

a second decoder for receiving all binary bits but the least significant bit of the second code and for selectively energizing one of a plurality of parallel outputs; and a second plurality of discrete frequency oscillators for receiving said second decoder outputs and for providing said outputs representative of said second plurality of discrete frequencies.

5. A frequency sweep generator as defined in claim 4 wherein said first binary counter and said second binary counter are identical.

6. A frequency sweep generator as defined in claim 5 wherein said first decoder and said second decoder are identical.

7. A frequency sweep generator as defined in claim 6 wherein said second plurality of discrete frequency oscillators are crystal oscillators.

8. A frequency sweep generator as defined in claim 6 wherein said sampling means comprises:

a first plurality of gates having a first input connected to receive said outputs representative of said first plurality of discrete frequencies and a second input connected to receive the least significant bit of said first binary code for enabling said first plurality of discrete frequencies to pass to outputs thereof;

an inverter connected to receive the least significant bit of said first binary code and for inverting said bit to its alternate binary state;

a second plurality of gates having a first input connected to receive said outputs representative of said second plurality of discrete frequencies and a second input connected to receive said inverted bit for enabling said second plurality of discrete frequencies to pass to the outputs thereof; and an output terminal commonly connected to said output of said first and second plurality of gates.

9. A frequency sweep generator for producing a periodic series of discrete constant amplitude frequencies, comprising:

a first binary counter for receiving clock pulses and for providing a first parallel binary code indicative of the number of clock pulses;

a first decoder for receiving all binary bits but the least significant bit of the first code and for selectively energizing one of a plruality of parallel outputs;

a first plurality of discrete frequency oscillators for receiving respective ones of said first decoder outputs and for providing discrete frequency signal outputs in response thereto;

a first plurality of gates for receiving the first plurality of oscillator outputs and said least significant bit and for passing respective ones of said discrete frequency signal outputs in response thereto;

delay means for receiving said clock pulses and for providing output pulses delayed one period;

a second binary counter for receiving said delayed pulses and for providing a second parallel binary code indicative of the number of said delayed clock pulses;

a second decoder for receiving all binary bits but the least significant bit of the second code and for selectively energizing one of a plurality of parallel outputs;

a second plurality of discrete frequency oscillators for receiving respective ones of said second decoder outputs and for providing discrete frequency signal outputs in response thereto;

an inverter for receiving said least significant bit of the first code and for inverting said bit to its alternate binary state; and a second plurality of gates for receiving the second plurality of oscillator outputs and said inverted bits and for passing respective ones of said discrete frequency signal outputs in response thereto, the outputs of said first and second pluralities of gates being connected to a common output.

* * * * *